(12) United States Patent
Kuo et al.

(10) Patent No.: US 8,939,723 B2
(45) Date of Patent: Jan. 27, 2015

(54) COMBINING ASSEMBLY FOR FAN FIXING BASE

(75) Inventors: Chung-I Kuo, Luzhu Township, Taoyuan County (TW); Chen-Tung Sun, Luzhu Township, Taoyuan County (TW); Ta-Chih Chung, Luzhu Township, Taoyuan County (TW)

(73) Assignee: AIC Inc., Taoyuan County (TW)

( * ) Notice: Subject to any disclaimer, the term of this patent is extended or adjusted under 35 U.S.C. 154(b) by 451 days.

(21) Appl. No.: 13/367,996

(22) Filed: Feb. 7, 2012

(65) Prior Publication Data

US 2013/0202429 A1    Aug. 8, 2013

(51) Int. Cl.
| | |
|---|---|
| F01D 25/26 | (2006.01) |
| F01D 25/28 | (2006.01) |
| F04D 29/60 | (2006.01) |
| F01D 25/04 | (2006.01) |
| F04D 29/66 | (2006.01) |

(52) U.S. Cl.
USPC ........................................ 415/213.1; 415/119

(58) Field of Classification Search
CPC ..... F04D 19/002; F04D 19/007; F04D 25/08; F04D 29/66; F04D 29/663; F04D 29/664; F04D 29/668; F04D 29/4226
USPC ............................. 415/119, 213.1, 214.1, 220
See application file for complete search history.

(56) References Cited

U.S. PATENT DOCUMENTS

| | | | |
|---|---|---|---|
| 5,186,605 A * | 2/1993 | Tracy | 601/2 |
| 6,934,153 B2 * | 8/2005 | Lee et al. | 361/697 |
| 7,245,490 B2 * | 7/2007 | Chou et al. | 361/695 |
| 7,365,975 B2 * | 4/2008 | Xia et al. | 361/695 |
| 7,697,287 B2 * | 4/2010 | Yin | 361/695 |
| 8,047,780 B2 * | 11/2011 | Chen et al. | 415/213.1 |
| 2010/0129235 A1 * | 5/2010 | Qian | 417/363 |
| 2012/0163970 A1 * | 6/2012 | Shu et al. | 415/213.1 |
| 2013/0045108 A1 * | 2/2013 | Zhou et al. | 416/244 R |

* cited by examiner

*Primary Examiner* — Dwayne J White
*Assistant Examiner* — Brian P Wolcott
(74) *Attorney, Agent, or Firm* — Chun-Ming Shih; HDLS IPR Services

(57) ABSTRACT

A combining assembly for a fan fixing base is fixed in a housing and includes a fan module and a frame plate. The fan module includes a fixing base, a heat-dissipating fan disposed in the fixing base, and a plurality of locking elements. The heat-dissipating fan is provided with a plurality of locking holes. The fixing base has a plurality of through-holes. The locking elements are disposed through the through-holes to be connected into the locking holes, thereby fixing the heat-dissipating fan into the fixing base. The frame plate is provided with a plurality of positioning troughs to correspond to the locking elements. The fan module is engaged in the positioning troughs via the locking elements.

10 Claims, 8 Drawing Sheets

COMBINING ASSEMBLY FOR FAN FIXING BASE

BACKGROUND OF THE INVENTION

1. Field of the Invention

The present invention relates to a fan fixing base, and in particular to a combining assembly for combining a fan fixing base with a housing.

2. Description of Prior Art

Traditionally, main boards, a power supply and other electronic devices are provided within a computer housing. Since these electronic devices generate a lot of heat during their operation, a plurality of heat-dissipating fans are often provided in the computer housing in order to maintain the normal operation of the whole computer system. For this purpose, a fan frame is provided within the computer housing and these heat-dissipating fans are fixed onto the fan frame. By means of the airflow generated by the heat-dissipating fans, the heat generated by the electronic devices can be taken away.

The conventional fan frame is fixed to the housing by screws. However, fixing the fan frame by the screws is time-consuming and laborious, and should be completed by a special tool (i.e. screw driver). On the other hand, when the fan is operated, the screws and metallic parts will generate noise due to their vibration. Even, the vibration makes the screws or bolts loose, which may deteriorate the safety in operation. In order to reduce the time for fixing the fan frame by screws, a common solution is to reduce the number of screws. Although reducing the number of screws shortens the time for fixing the fan frame, the reduced number of screws also decreases the fixing strength achieved by the screws, which causes the fan to vibrate during its operation. Further, another problem in the conventional fan frame is that the screws have to be removed one by one so as to take off the fan or change the position of the fan frame, which makes the user feel inconvenient in use.

Therefore, in order to solve the above-mentioned problems, the present Inventor proposes a novel and reasonable structure based on his expert knowledge and deliberate researches.

SUMMARY OF THE INVENTION

The present invention is to provide a combining assembly for a fan fixing base, which is capable of simplifying the fixation of the fan.

The present invention provides a combining assembly for a fan fixing base, which is fixed in a housing and includes a fan module and a frame plate. The fan module comprises a fixing base, a heat-dissipating fan disposed in the fixing base, and a plurality of locking elements. The heat-dissipating fan is provided with a plurality of locking holes. The fixing base has a plurality of through-holes. The locking elements are disposed through the through-holes to be connected into the locking holes, thereby fixing the heat-dissipating fan into the fixing base. The frame plate is fixed into the housing. The frame plate is provided with a plurality of positioning troughs to correspond to the locking elements. The fan module is engaged in the positioning troughs via the locking elements.

The present invention provides a combining assembly for a fan fixing base. The positioning trough is tapered from top to bottom, so that the locking elements can be firmly engaged in the positioning troughs, thereby fixing the fan module into the positioning troughs of the frame plate.

The present invention provides a combining assembly for a fan fixing base, wherein the fan module has a plurality of locking pads. The locking pads are made of vibration-absorbing materials, so that the locking pads can absorb the vibration generated during the operation of the heat-dissipating fan.

In comparison with prior art, the present invention has the following advantageous features. The combining assembly for a fan fixing base according to the present invention is provided with positioning troughs on the frame plate. The fan module is fixed into the positioning troughs via the locking elements. The user can attach the fan module to the frame plate rapidly without using a special tool. On the other hand, the user can detach the fan module from the frame plate easily. Thus, the assembly of the fan module is simplified. On the other hand, the positioning trough of the frame plate is tapered from top to bottom, and the locking elements can be firmly engaged in the positioning troughs, so that the fan module can be fixedly positioned in the frame plate. The locking pad made of vibration-absorbing materials can absorb the vibration generated during the operation of the heat-dissipating fan, so that the noise is almost eliminated. Therefore, the present invention really demonstrates practicability.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
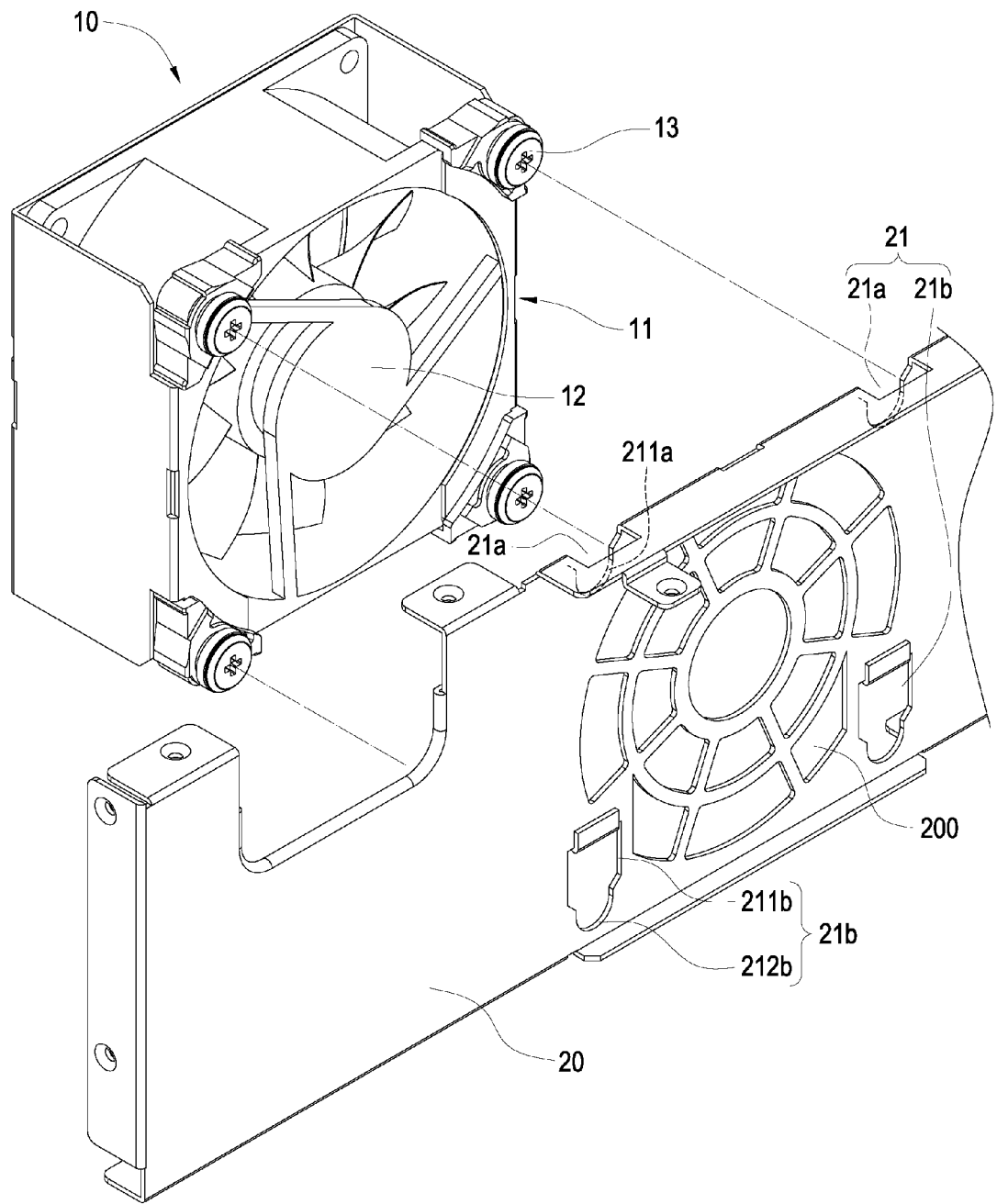
FIG. 1 is an assembled perspective view showing the combining assembly for a fan fixing base according to the present invention.
Figure 2:
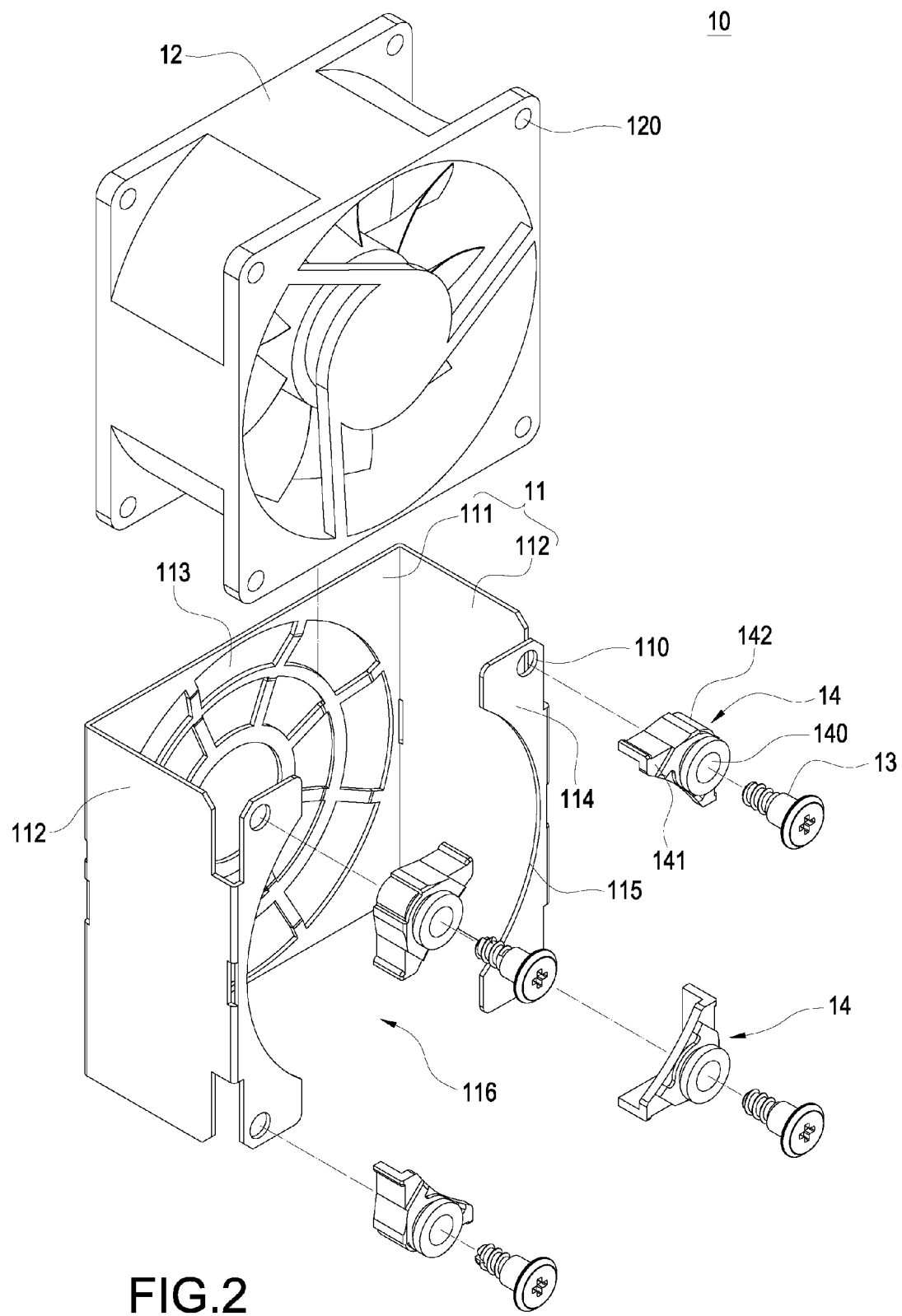
FIG. 2 is an exploded perspective view showing the fan module of the present invention.
Figure 3:
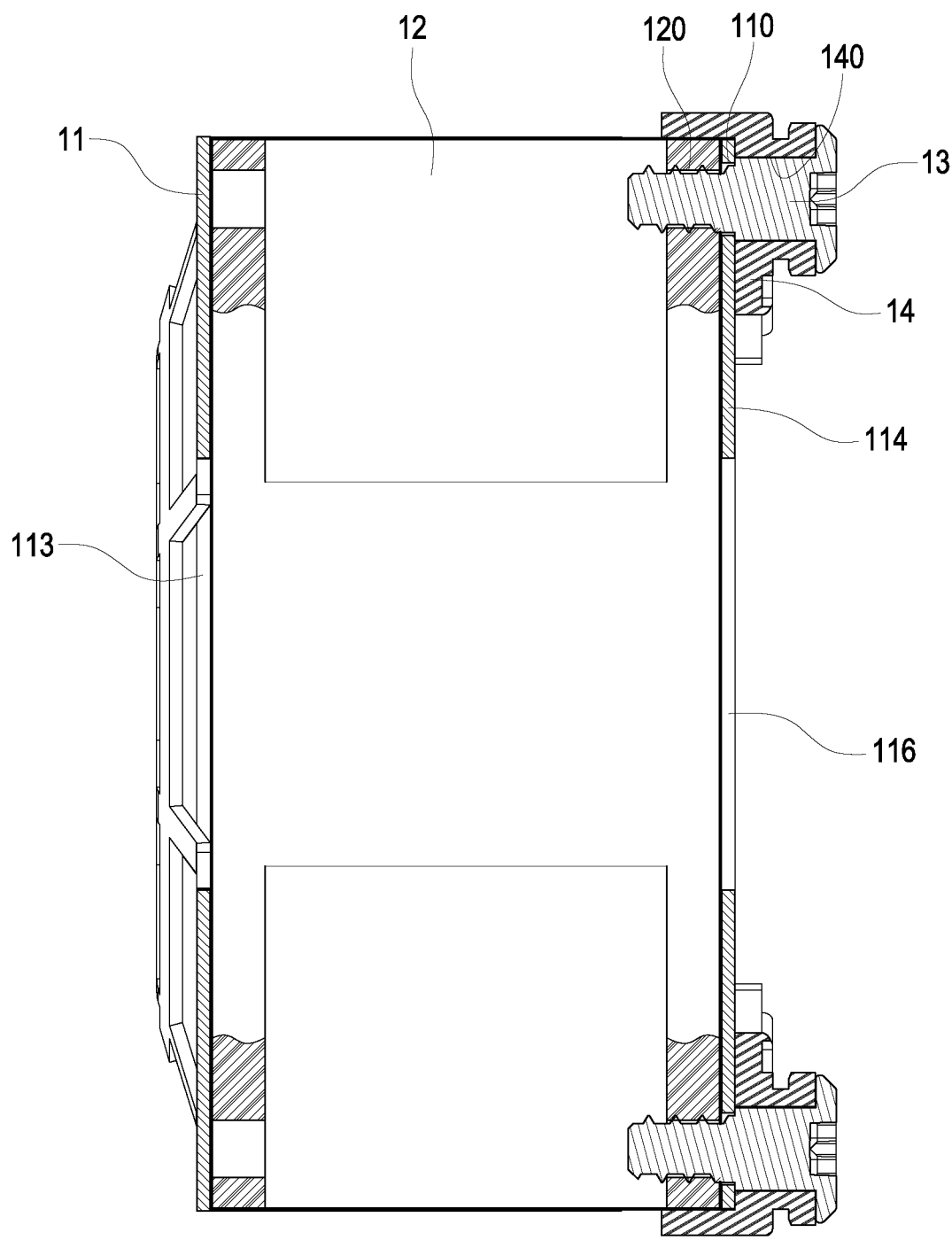
FIG. 3 is an assembled cross-sectional view showing the fan module of the present invention.

Please refer to FIGS. 1 to 3. FIG. 1 is an assembled perspective view showing the combining assembly for a fan fixing base according to the present invention. FIG. 2 is an exploded perspective view showing the fan module of the present invention. FIG. 3 is an assembled cross-sectional view showing the fan module of the present invention. The combining assembly 1 for a fan fixing base according to the present invention includes a fan module 10 and a frame plate 20.

The fan module 10 comprises a fixing base 11, a heat-dissipating fan 12 disposed in the fixing base 11, and a plurality of locking elements 13. The heat-dissipating fan 12 is provided with a plurality of locking holes 120. One side of the fixing base 11 has a plurality of through-holes 110. The locking elements 13 are disposed through the through-holes 110 to be connected into the locking holes 120, thereby fixing the heat-dissipating fan 12 into the fixing base 11.

Preferably, the fan module 10 further includes a plurality of locking pads 14. Each locking pad 14 is provided with a penetration hole 140. Each locking element 13 is disposed through the penetration hole 140 and the through-hole 110 sequentially to be connected into the locking hole 120. It should be noted that, these locking pads 14 are made of vibration-absorbing materials. Thus, the vibration generated during the operation of the heat-dissipating fan 12 can be absorbed by the locking pads 14.

In the present embodiment, the locking element 13 is a screw, and the locking hole 120 is a screw hole. The fixing base 11 is substantially formed into a U shape. The fixing base 11 comprises a stopping plate 111 and two side plates 112 extending from both side edges of the stopping plate 111. The stopping plate 111 is provided with a plurality of first heat-dissipating holes 113. The outer edges of the two side plates 112 extend inwardly to form a wing 114 respectively. The wing 114 is provided with the through-holes 110. Each of the two wings 114 has a curved notch 115. The curved notches 115 of the two wings 114 define an opening 116 opposite to the stopping plate 111. The opening 116 is substantially located to correspond to the center of the heat-dissipating fan 12. Further, each locking pad 14 is substantially formed into an L shape to have a combining surface 141 and a positioning surface 142. The combining surface 141 is adhered to the wing 14, and the positioning surface 142 is adhered to the side plate 112.

On the other hand, the frame plate 20 is provided with a plurality of positioning troughs 21 to correspond to the locking elements 13. The fan module 10 is engaged into the positioning troughs 21 via the locking elements 13. The frame plate 20 is provided with a plurality of second heat-dissipating holes 200 to correspond to the heat-dissipating fan 12. These positioning troughs 21 are located outside the heat-dissipating holes 200.

Preferably, each positioning trough 21 is tapered from top to bottom. In the present embodiment, these positioning troughs 21 comprises a plurality of first positioning troughs 21a and a plurality of second positioning troughs 21b. The first positioning troughs 21a are provided on the top edge of the frame plate 20, and the second positioning troughs 21b are provided near the bottom edge of the frame plate 20. Further, the first positioning trough 21a is narrowed inwardly from the top edge of the frame plate 20 to form a curved trough 211a. The second positioning trough 21b comprises a rectangular opening 211b and a semi-circular opening 212b connected to the rectangular opening 211b. The diameter of the semicircular opening 212b is smaller than the width of the rectangular opening 211b.

Figure 4:
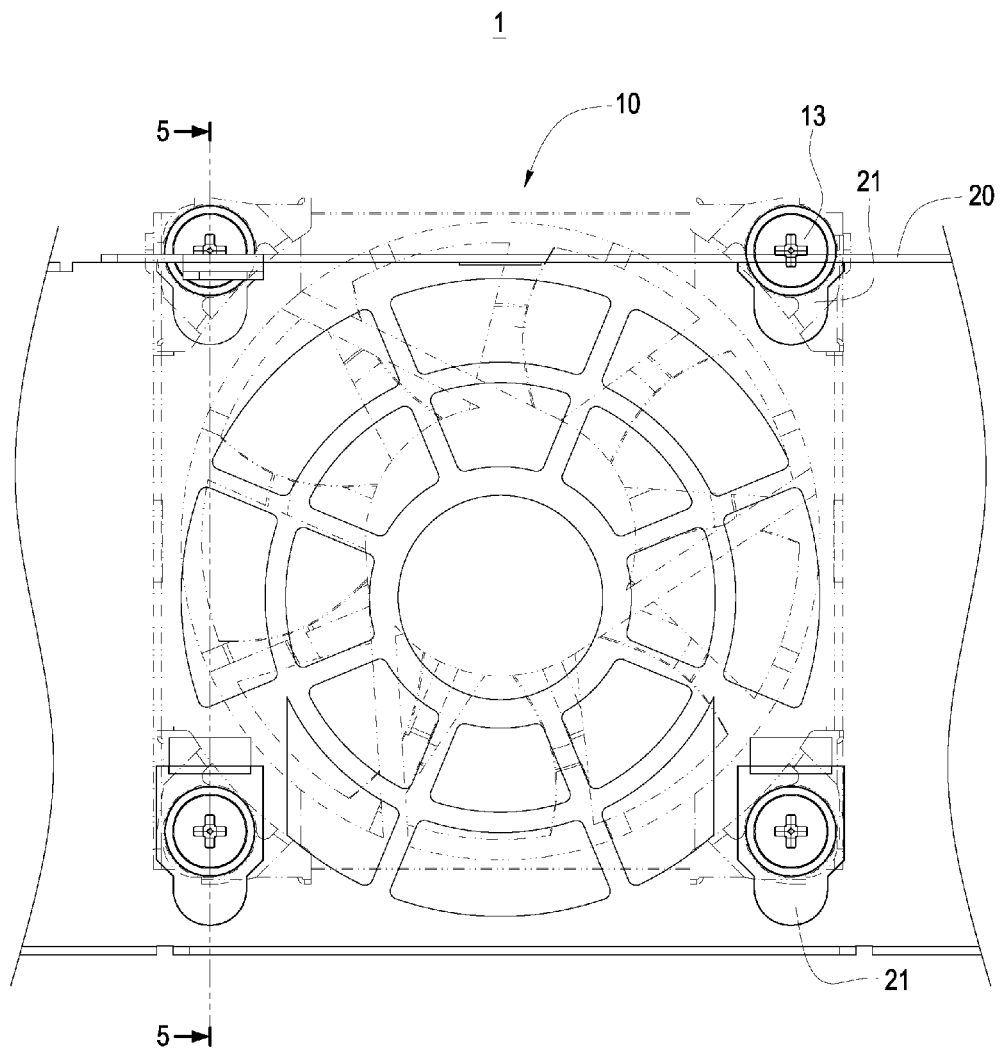
FIG. 4 is a plan view showing that the fan module of the present invention is combined with the frame plate.
Figure 5:
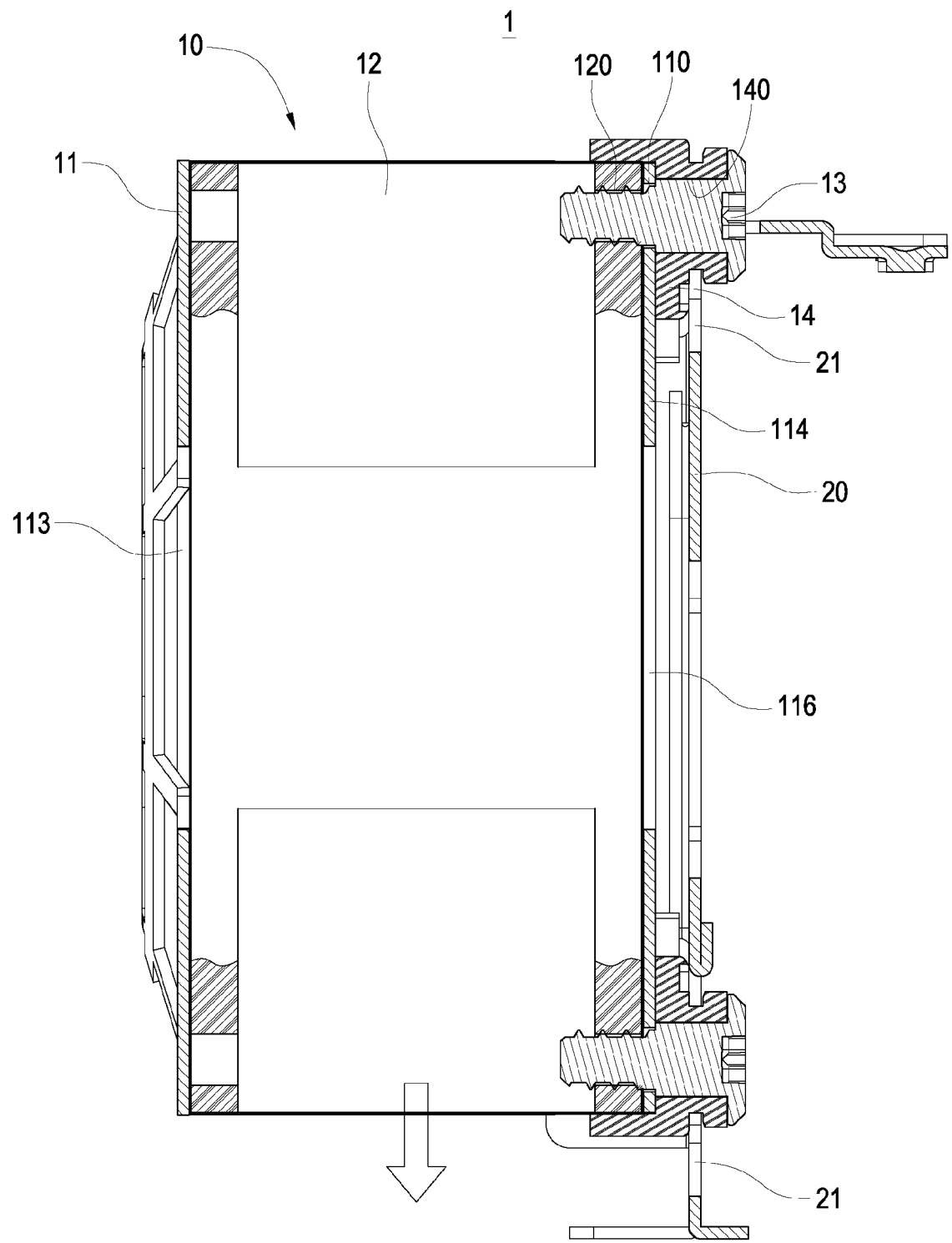
FIG. 5 is a cross-sectional view taken along the line 5-5 in FIG. 4.
Figure 6:
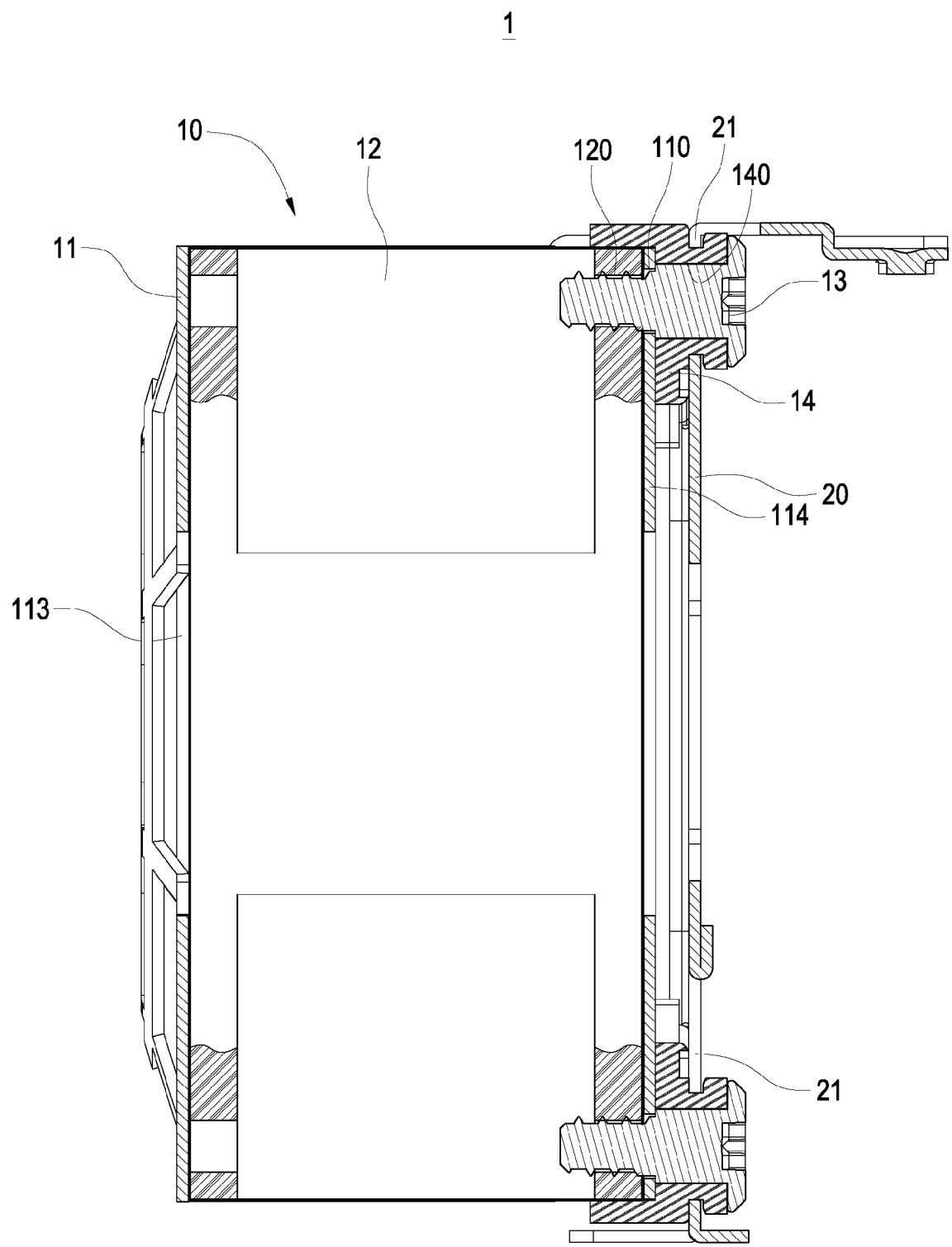
FIG. 6 is a cross-sectional view showing the state after the fan module of the present invention is combined with the frame plate.
Figure 7:
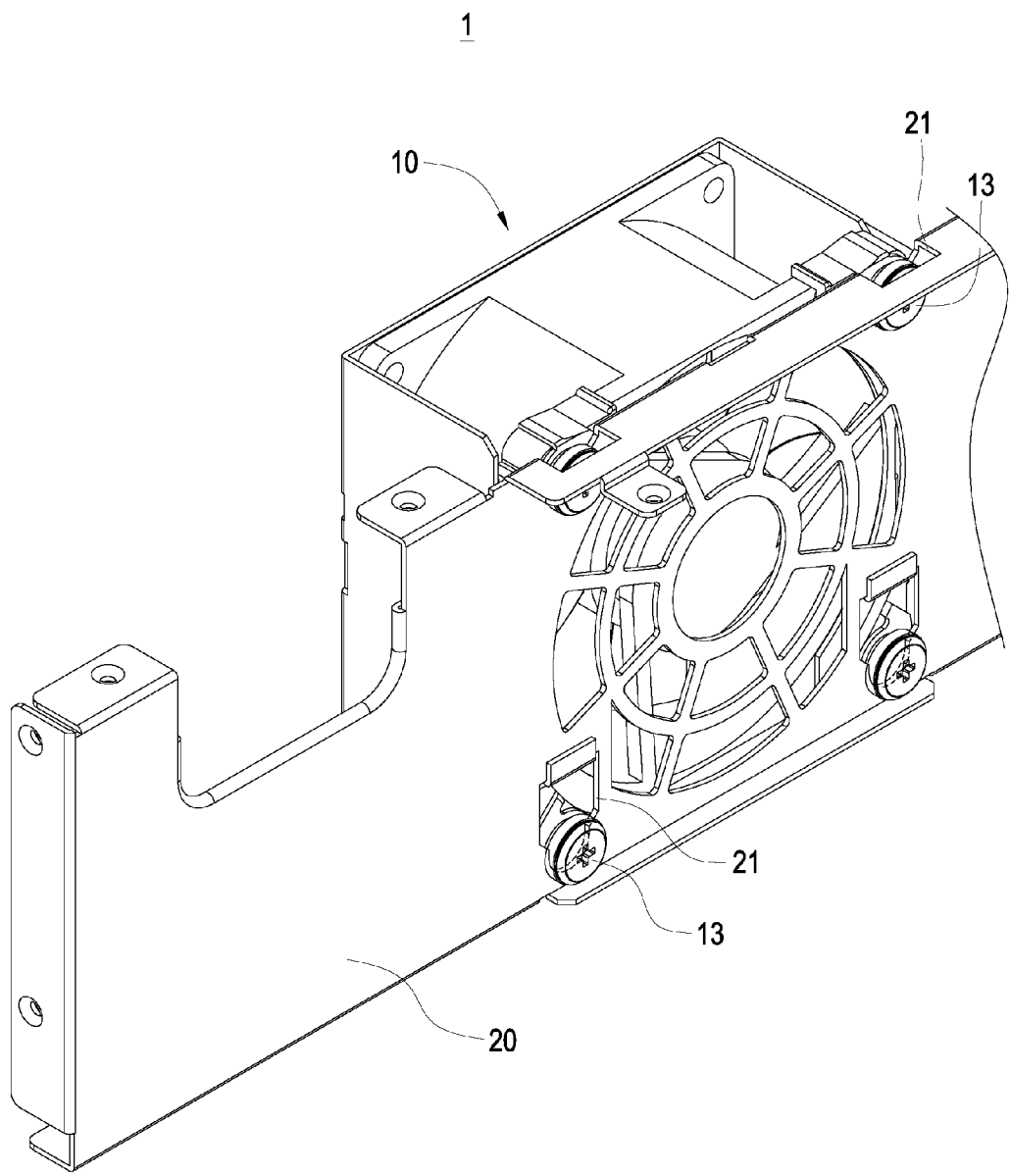
FIG. 7 is a schematic view showing the external appearance after the fan module of the present invention is combined with the frame plate.

Please refer to FIGS. 4 to 7. FIG. 4 is a plan view showing that the fan module of the present invention is combined with the frame plate. FIG. 5 is a cross-sectional view taken along the line 5-5 in FIG. 4. FIG. 6 is a cross-sectional view showing the state after the fan module of the present invention is combined with the frame plate. FIG. 7 is a schematic view showing the external appearance after the fan module of the present invention is combined with the frame plate. The locking elements 13 locks the heat-dissipating fan 12 to the fixing base 11. After completing the assembly of the fan module 10, the fan module 10 is engaged with the frame plate 20.

The locking elements 13 of the fan module 10 are aligned with the positioning troughs 21 of the frame plate 20. Then, the locking elements 13 are temporarily located above the positioning troughs 21 respectively. Then, applying a force to the fan module 10 to make the locking elements 13 to move from the upside to the underside of the positioning troughs 21 (at the curved trough 211a and the semi-circular opening 212b in FIG. 1). Since each positioning trough 21 is tapered from top to bottom, the locking elements 13 can be firmly engaged in the positioning troughs 21 (at the curved troughs 211a and the semi-circular openings 212b in FIG. 1). In this way, the fan module 10 can be tightly engaged in the positioning troughs 21 of the frame plate 20.

Figure 8:
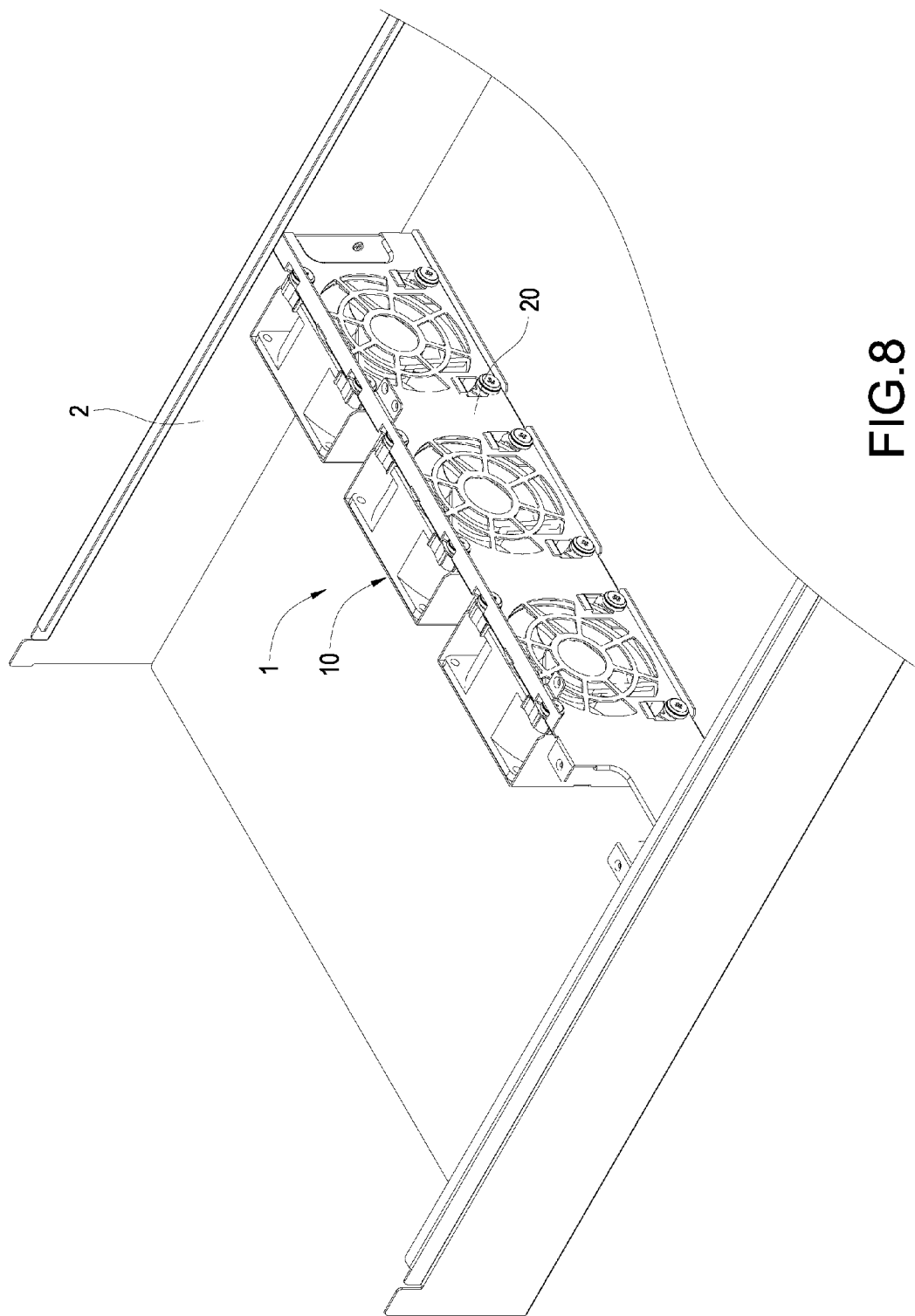
FIG. 8 is an assembled view showing that the combining assembly for a fan module of the present invention is combined in a housing.

Please refer to FIG. 8, which is an assembled view showing that the combining assembly for a fan module of the present invention is combined in a housing. In practice, the frame plate 20 is fixed in a housing 2. In this way, the combining assembly of the present invention can be fixed in the housing 2.

It should be noted that, when the fan module 10 is to be repaired or replaced, the user can detach the fan module 10 from the frame plate 10 easily without using a special tool. Thus, the assembly of the fan module 10 is simplified.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A combining assembly for a fan fixing base, fixed in a housing and including:
   a fan module comprising a fixing base, a heat-dissipating fan disposed in the fixing base, and a plurality of locking elements, the heat-dissipating fan being provided with a plurality of locking holes, one side of the fixing base having a plurality of through-holes, the locking elements being disposed through the through-holes to be fixedly connected into the locking holes, thereby fixing the heat-dissipating fan into the fixing base;
   a plurality of locking pads, each locking pad being provided with a penetration hole, the locking elements being disposed through the penetration holes and the plurality of through-holes to be connected into the locking holes respectively; and
   a frame plate fixed into the housing, the frame plate being provided with a plurality of positioning troughs to correspond to the locking elements, the fan module being engaged in the positioning troughs via the locking elements,
   wherein the fixing base comprises a stopping plate and two side plates extending from both first side edges of the stopping plate, the two side plates extend inwardly to form two wings respectively,
   wherein two corners of each of two second edges of each of the two side plates away from the stopping plate are truncated to form gaps between each of the two side plates and each of the two wings, and the plurality of locking pads are fitted into each of the gaps respectively, and
   wherein the plurality of locking elements penetrate the penetration holes of the plurality of locking pads respectively and further are locked into the plurality of locking holes of the heat-dissipating fan to fix the heat-dissipating fan to the fixing base, the fixing base is further hooked and slidably fixed to the frame plate by pressing the plurality of locking pads into the plurality of positioning troughs on the frame plate.

2. The combining assembly for a fan fixing base according to claim 1, wherein the fixing base is formed into a U shape, and the stopping plate is provided with a plurality of first heat-dissipating holes.

3. The combining assembly for a fan fixing base according to claim 2, wherein each locking pad is formed into an L shape and has a combining surface and a positioning surface, the combining surface is adhered to the wing, and the positioning surface is adhered to the side plate.

4. The combining assembly for a fan fixing base according to claim 2, wherein the wing is provided with the plurality of through-holes, the two wings have a curved notch respectively, the curved notches of the two wings define an opening opposite to the stopping plate.

5. The combining assembly for a fan fixing base according to claim 2, wherein the frame plate is provided with a plurality of second heat-dissipating holes to correspond to the heat-dissipating fan, the plurality of positioning troughs are located outside the second heat-dissipating holes.

6. The combining assembly for a fan fixing base according to claim 1, wherein each positioning trough is tapered from top to bottom.

7. The combining assembly for a fan fixing base according to claim 6, wherein the positioning troughs comprise a plurality of first positioning troughs and a plurality of second positioning troughs, the first positioning troughs are provided on a top edge of the frame plate, and the second positioning troughs are provided on a bottom edge of the frame plate.

8. The combining assembly for a fan fixing base according to claim 7, wherein each first positioning trough is narrowed from the top edge of the frame plate to form a curved trough.

9. The combining assembly for a fan fixing base according to claim 7, wherein each second positioning trough comprises a rectangular opening and a semicircular opening connected to the rectangular opening, a diameter of the semicircular opening is smaller than a width of the rectangular opening.

10. The combining assembly for a fan fixing base according to claim 1, wherein the locking element is a screw, and the locking hole is a screw hole.

\* \* \* \* \*